(12) United States Patent
Jeon et al.

(10) Patent No.: US 8,901,646 B2
(45) Date of Patent: Dec. 2, 2014

(54) SEMICONDUCTOR DEVICE

(71) Applicant: Samsung Electronics Co., Ltd., Suwon-si (KR)

(72) Inventors: Namho Jeon, Hwaseong-si (KR); Min-chul Park, Hwaseong-si (KR); Seunguk Han, Suwon-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/727,995

(22) Filed: Dec. 27, 2012

(65) Prior Publication Data

US 2013/0168774 A1    Jul. 4, 2013

(30) Foreign Application Priority Data

Jan. 3, 2012    (KR) .................. 10-2012-0000579

(51) Int. Cl.
| | |
|---|---|
| *H01L 29/66* | (2006.01) |
| *G11C 11/408* | (2006.01) |
| *H01L 27/108* | (2006.01) |
| *H01L 27/088* | (2006.01) |
| *H01L 27/02* | (2006.01) |

(52) U.S. Cl.
CPC .......... *H01L 27/088* (2013.01); *G11C 11/4085* (2013.01); *H01L 27/10897* (2013.01); *G11C 11/4087* (2013.01); *H01L 27/0207* (2013.01)
USPC .......................................... 257/331; 438/142

(58) Field of Classification Search
CPC . H01L 27/1104; H01L 27/0207; H01L 27/11; H01L 2924/00; H01L 2224/48465; H01L 27/10855; H01L 27/10894; H01L 2224/49111; H01L 2224/49171; H01L 2224/49175; H01L 27/088; H01L 27/10814; H01L 21/76895; H01L 21/76897
USPC .......... 257/262, 368–401, E29.255–E29.313, 257/E29.315–E29.316, E21.409–E21.449; 438/135, 151, 197, 199, 201, 207, 216
See application file for complete search history.

(56) References Cited

U.S. PATENT DOCUMENTS

| | | | | |
|---|---|---|---|---|
| 4,841,481 | A | * | 6/1989 | Ikeda et al. .................... 365/154 |
| 5,521,860 | A | * | 5/1996 | Ohkubo ......................... 365/154 |
| 6,407,463 | B2 | * | 6/2002 | Kumagai et al. ............... 257/368 |

(Continued)

FOREIGN PATENT DOCUMENTS

| | | |
|---|---|---|
| JP | 2006-120952 | 5/2006 |
| JP | 209-277963 | 11/2009 |

(Continued)

*Primary Examiner* — Jae Lee
*Assistant Examiner* — Junaiden Mirsalahuddin
(74) *Attorney, Agent, or Firm* — Muir Patent Consulting, PLLC

(57) ABSTRACT

A semiconductor device may include a substrate including an active region defined by a device isolation layer, gate electrodes extending in a first direction on the substrate and spaced apart from each other, gate tabs extending in a second direction different from the first direction and connecting adjacent gate electrodes to each other, the gate tabs spaced apart from each other, and a first contact plug disposed on the active region under a space confined by the adjacent gate electrodes and adjacent gate tabs. The space may include a first region having a first width and a second region having a second width smaller than the first width, the first contact plug may be disposed on the active region under the second region.

19 Claims, 14 Drawing Sheets

(56) References Cited

U.S. PATENT DOCUMENTS

| | | | |
|---|---|---|---|
| 6,437,455 B2* | 8/2002 | Mori et al. | 257/369 |
| 7,432,143 B2 | 10/2008 | Cho et al. | |
| 7,646,665 B2 | 1/2010 | Kim et al. | |
| 7,729,195 B2 | 6/2010 | Youn et al. | |
| 7,842,981 B2 | 11/2010 | Lee et al. | |
| 8,228,755 B2 | 7/2012 | Park et al. | |
| 2002/0130426 A1* | 9/2002 | Karasawa et al. | 257/903 |
| 2007/0080397 A1 | 4/2007 | Manabe | |
| 2008/0128825 A1* | 6/2008 | Sato et al. | 257/369 |
| 2009/0283832 A1 | 11/2009 | Sugiura | |

FOREIGN PATENT DOCUMENTS

| | | |
|---|---|---|
| JP | 2009-277963 | 11/2009 |
| KP | 10-2009-0044481 A | 5/2009 |
| KR | 10-2005-0001100 A | 1/2005 |
| KR | 10-0728966 B1 | 6/2007 |
| KR | 10-2007-0078567 A | 8/2007 |
| KR | 10-2007-0088031 A | 8/2007 |
| KR | 10-2010-0066762 A | 6/2010 |
| KR | 10-2013-0017344 A | 2/2013 |

* cited by examiner

SEMICONDUCTOR DEVICE

CROSS-REFERENCE TO RELATED APPLICATIONS

This U.S. non-provisional patent application claims priority under 35 U.S.C. §119 to Korean Patent Application No. 10-2012-0000579, filed on Jan. 3, 2012, the entirety of which is incorporated by reference herein.

BACKGROUND

The inventive concept relates to a semiconductor device and, more particularly, to a semiconductor device including a sub-word line driver.

As semiconductor devices become more and more integrated, a hot electron induced punchthrough (HEIP) phenomenon of PMOS transistors may increase. For controlling the HEIP phenomenon, various research, such as regarding a layout of a semiconductor device, have been conducted.

SUMMARY

Embodiments of the inventive concept may provide semiconductor devices capable of controlling HEIP phenomenon and improving reliability.

According to some embodiments of the inventive concept, a semiconductor device may include: a substrate including an active region defined by a device isolation layer; gate electrodes extending in a first direction on the substrate and spaced apart from each other; gate tabs extending in a second direction different from the first direction and connecting adjacent gate electrodes to each other, the gate tabs spaced apart from each other; and a first contact plug disposed on the active region under a space confined by the adjacent gate electrodes and adjacent gate tabs. The space includes a first region having a first width and a second region having a second width smaller than the first width, and first contact plug is disposed on the active region under the second region.

In some embodiments, each of the gate tabs may be overlapped with a portion of the active region adjacent to the device isolation layer.

In other embodiments, the semiconductor device may further include: a first dopant region formed in the active region under the space; and a second dopant region formed in the active region disposed outside the space. The first contact plug may be electrically connected to the first dopant region.

In still other embodiments, one of the gate tabs may include a first portion having a third width and a second portion having a fourth width greater than the third width.

In yet other embodiments, one of the gate tabs may have a uniform width and include a bending portion.

In yet still other embodiments, each of the gate tabs may have a protrusion protruding with respect to an outer sidewall of the gate electrode in parallel with the second direction.

In yet still other embodiments, the protrusion of each of the gate tabs may have the same width as a width of a portion of the gate tab adjacent to the protrusion.

In yet still other embodiments, the protrusion of the each of the gate tabs may have the same width as the maximum width of each of the gate tabs.

In yet still other embodiments, each of the gate tabs may have a sidewall substantially coplanar with an outer sidewall of the gate electrode.

In yet still other embodiments, the gate electrodes may include a first gate electrode and a second gate electrode adjacent to the first electrode, the first gate electrode may be connected to the second electrode through the gate tabs, and the space may include a first space of which the first region is adjacent to the first electrode and a second space of which the second region is adjacent to the first gate electrode.

In yet still other embodiments, the gate tab disposed between the first space and the second space may include: a first portion having a third width; and a second portion having a fourth width greater than the third width.

In yet still other embodiments, the gate tab disposed between the first space and the second space may have a substantially uniform width and includes a bending portion.

In yet still other embodiments, each of the gate tabs may have the same structure as a stacked structure of each of the gate electrode, and each of the gate tabs may include the same material as a material included in the gate electrode.

In yet still other embodiments, the adjacent gate electrodes and the gate tabs connecting the adjacent gate electrode to each other may constitute one body.

In yet still other embodiments, the semiconductor device may further include: a second contact plug electrically connected to the second dopant region.

In yet still other embodiments, a semiconductor device may comprise a semiconductor substrate, the semiconductor substrate including an active region defined by one or more device isolation insulators, a first transistor formed at the active region, the first transistor comprising: a conductive ring formed on the active region, the conductive ring comprising a first gate, a second gate, a first tab portion connecting the first gate to the second gate, and a second tab portion spaced apart from the first tab portion connecting the first gate to the second gate, the second tab portion being spaced apart from the first tab portion a first distance at the first gate and a second distance at the second gate, the first distance being smaller than the second distance; a first source/drain formed at the active region within an area confined by the conductive ring; a second source/drain formed at the active region outside the conductive ring; and a first conductive via connecting to the first source/drain region at a location closer to the first gate than to the second gate.

The first tab portion may be formed over a first shallow trench isolation layer and the second tab portion may be formed over a second shallow trench isolation layer.

The second source/drain may comprise a first region of the active region outside the conductive ring and a second region of the active region outside the conductive ring.

The semiconductor device may also comprise a conductive wire; and a second conductive via electrically connecting the first region of the second source/drain to the conductive wire, and a third conductive via electrically connecting the second region of the second source/drain to the conductive wire.

The first transistor is a first transistor of a word line driver, such as a sub word line driver, and the semiconductor device may further comprise a word line connected to the first conductive via.

The first source/drain may be formed of a dopant region within the active region, the dopant region comprised of the active region corresponding to the area confined by the conductive ring and extending to the first and second device isolation insulators.

The semiconductor device may include a plurality of first transistors, such as those noted herein, each first transistor sharing a tab portion with an adjacent first transistor.

The semiconductor device may include a plurality of first transistors, such as those noted herein, each first transistor sharing a second source/drain with an adjacent first transistor. These first transistor may include gate electrodes formed of separate electrical nodes.

According to some embodiments, a semiconductor device may comprise a semiconductor substrate including an active region bounded by one or more device isolation regions and a transistor comprising: a ring shaped conductor including a first gate, a second gate, a first tab connecting the first gate to the second gate, a second tab connecting the first gate to the second gate; a first dopant region in the active region, at least a portion of the first dopant region interposed between the first gate and the second gate and interposed between the first tab and the second tab, the first dopant region forming a first source/drain region of the transistor; a second dopant region in the active region outside the ring shaped conductor; and a conductive via connecting to the first dopant region, wherein the first and second tabs each include protrusion portions extending toward the conductive via.

Other embodiments are directed to methods for manufacturing devices and systems described herein. Other embodiments are directed to systems including the semiconductor devices described herein.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
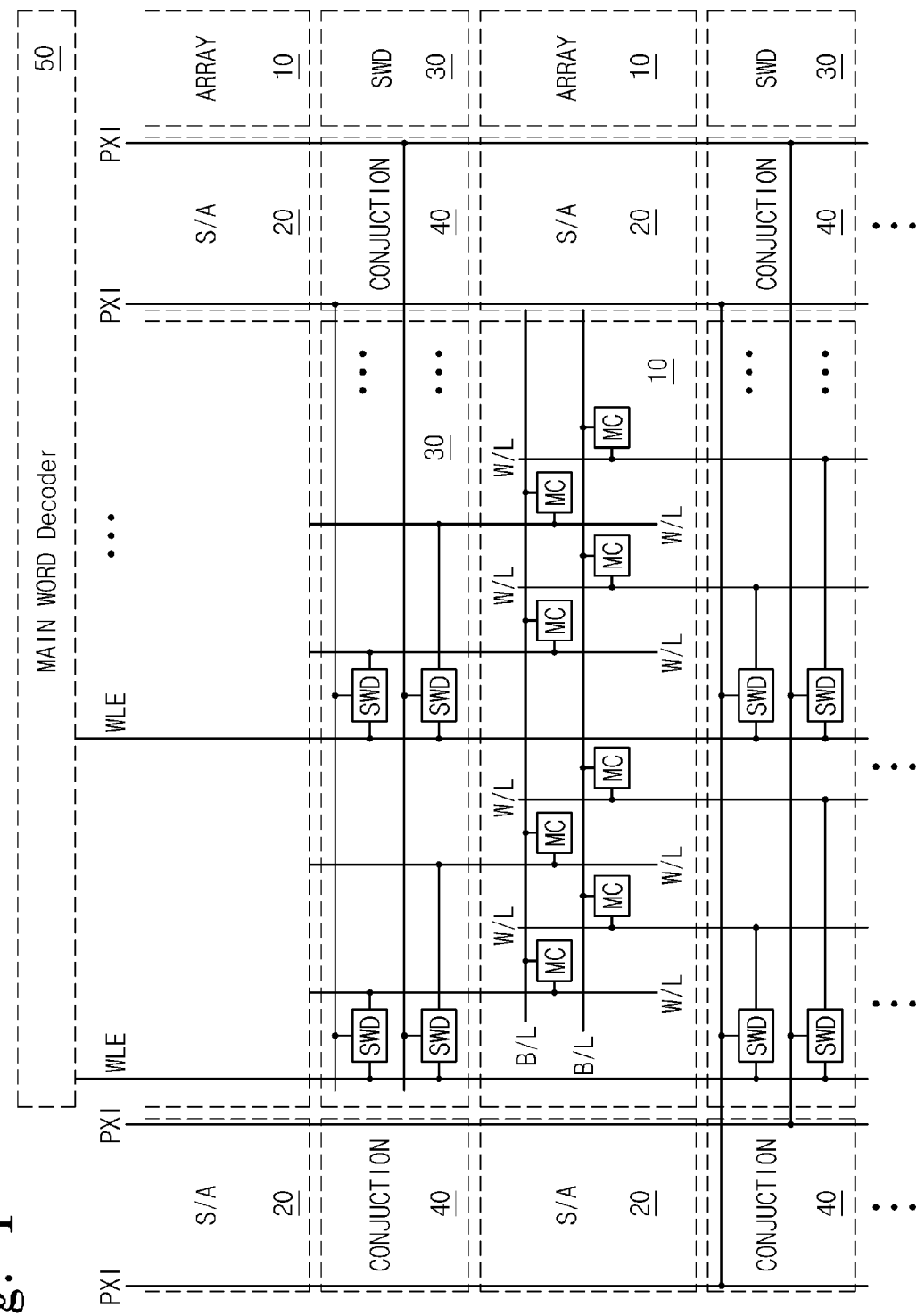
FIG. 1 is a block diagram illustrating a layout structure of a general dynamic random access memory (DRAM) device.

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that may be idealized in certain respects. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features although still may be considered rectangular by one of ordinary skill. Thus, the regions illustrated in the figures may be schematic in nature and their shapes may not illustrate the actual shape of a region of a device and are not intended to limit the scope of example embodiments.

Figure 2:
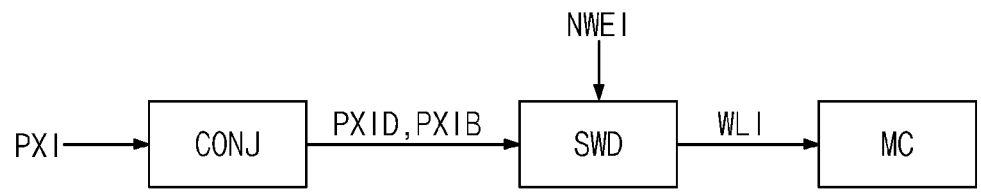
FIG. 2 is a block diagram illustrating signals of a DRAM device.
Figure 3:
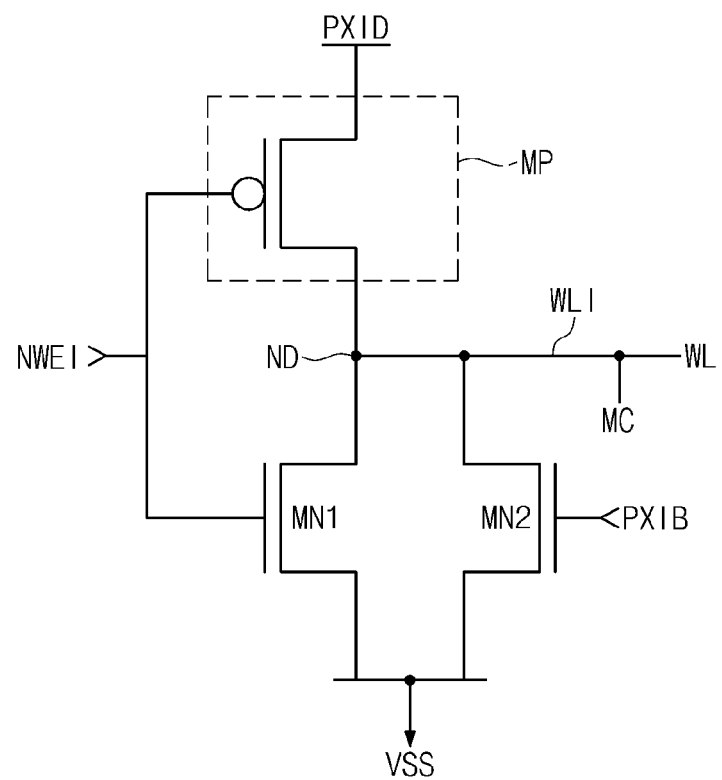
FIG. 3 is a circuit diagram illustrating a sub-word line driving circuit.

FIG. 1 is a block diagram illustrating a layout structure of an exemplary dynamic random access memory (DRAM) device. FIG. 2 is a block diagram illustrating exemplary signals of a DRAM device. FIG. 3 is a circuit diagram illustrating an exemplary sub-word line driving circuit.

Referring to FIG. 1, a DRAM device may include a plurality of sub-arrays 10 arranged in a matrix form having rows and columns. Each of the sub-arrays 10 may includes a plurality of word lines W/L, a plurality of bit lines B/L, and a plurality of memory cells MCs respectively disposed at cross points of the word lines W/L and the bit lines B/L. Sensing amplification regions 20 may be disposed between the sub-arrays 10 arranged in a longitudinal direction of the bit line B/L. A plurality of sensing amplifiers S/A may be provided in each of the sensing amplification regions 20. Each of the sensing amplifiers S/A may be connected to the bit lines B/L which are arranged along the same direction (left to right in FIG. 1) and are respectively disposed in the sub-arrays 10 adjacent to each of the sensing amplification regions 20. The sensing amplifiers S/A in each of the sensing amplification regions 20 may be shared by the sub-arrays 10 on either side of the respective sensing amplification region 20.

Sub-word line driving regions 30 may be disposed at both sides of each of the sub-arrays 10 in a longitudinal direction of the word line W/L (in FIG. 1, above and/or below sub-arrays 10). A plurality of sub-word line drivers SWD are provided in each of the sub-word line driving regions 30. Some of the word lines W/L in each of the sub-arrays 10 may be selected/driven by a respective one of the sub-word line drivers SWD disposed at one side thereof (e.g. an upper side of each of the sub-arrays 10), and the others of the word lines W/L in each of the sub-arrays 10 may be selected/driven by the sub-word line drivers SWD disposed at another side thereof (e.g. a lower side of each of the sub-arrays 10). For example, every other word line (e.g., odd word lines W/L) may be driven by sub-word line drivers SWD located above a particular sub-array 10, and remaining word lines W/L (e.g., odd word lines W/L), disposed between this first group, may be driven by sub-word line drivers W/L located below this particular sub-array 10. Each of the sub-word line drivers SWD may select a corresponding word line in response to a PXI signal generated from a PXI generator (not shown) and a main word line WLE connected to a main word decoder. Conjunction regions 40 may be disposed between the sensing amplification regions 20 arranged in the longitudinal direction of the word line W/L.

Referring to FIGS. 1 and 2, a first sub-word line control signal PXID and a second sub-word line control signal PXIB may be generated from the conjunction region 40 based on the PXI signal.

A sub-word line driving circuit of the sub-word line driver SWD may generate a word line driving signal WLI based on a main line driving signal NWEI generated from the main word decoder, the first sub-word line control signal PXID, the second sub-word line control signal PXIB. The sub-array 10 may be operated in response to the word line driving signal WLI.

Referring to FIG. 3, the sub-word line driving circuit may include a PMOS transistor MP, a first NMOS transistor MN1, and a second NMOS transistor MN2.

The PMOS transistor MP may include a gate applied with the main word line driving signal NWEI, a source applied with the first sub-word line control signal PXID, and a drain connected to a node ND.

The first NMOS transistor MN1 may include a gate applied with the main word line driving signal NWEI, a drain connected to the node ND, and a source connected to a ground VSS.

The second NMOS transistor NM2 may include a gate applied with the second sub-word line control signal PXIB, a drain connected to the node ND, and a source connected to the ground VSS.

Other details regarding exemplary DRAM circuitry may be found in U.S. Pat. No. 7,646,665, which is hereby incorporated by reference in its entirety. In this disclosure, the semiconductor devices according to embodiments of the inventive concept are described using the sub-word line driver of a DRAM device as an example. However, the inventive concept is not limited thereto.

Figure 4:
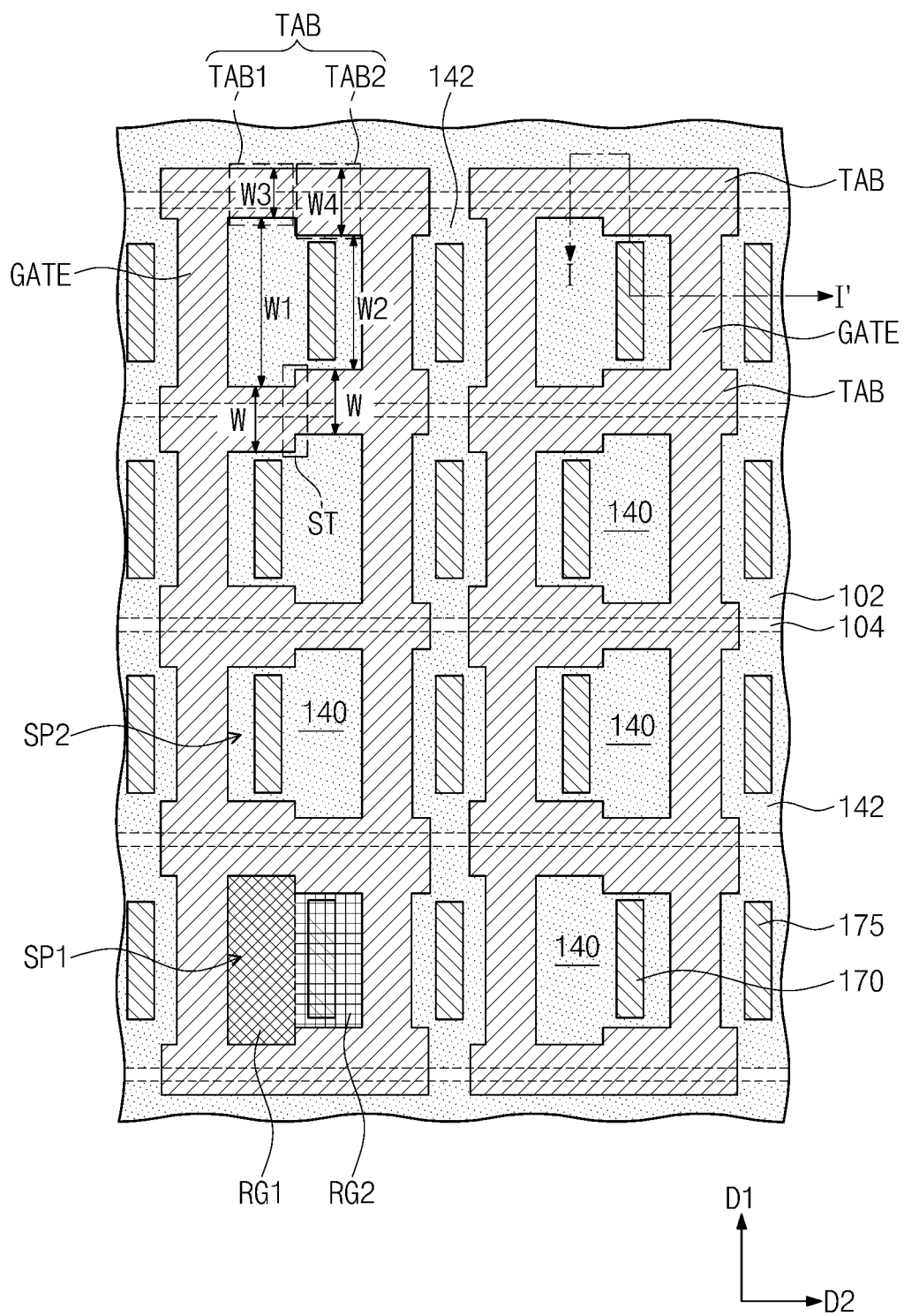
FIG. 4 is a plan view illustrating a semiconductor device according to an embodiment of the inventive concept.
Figure 5:
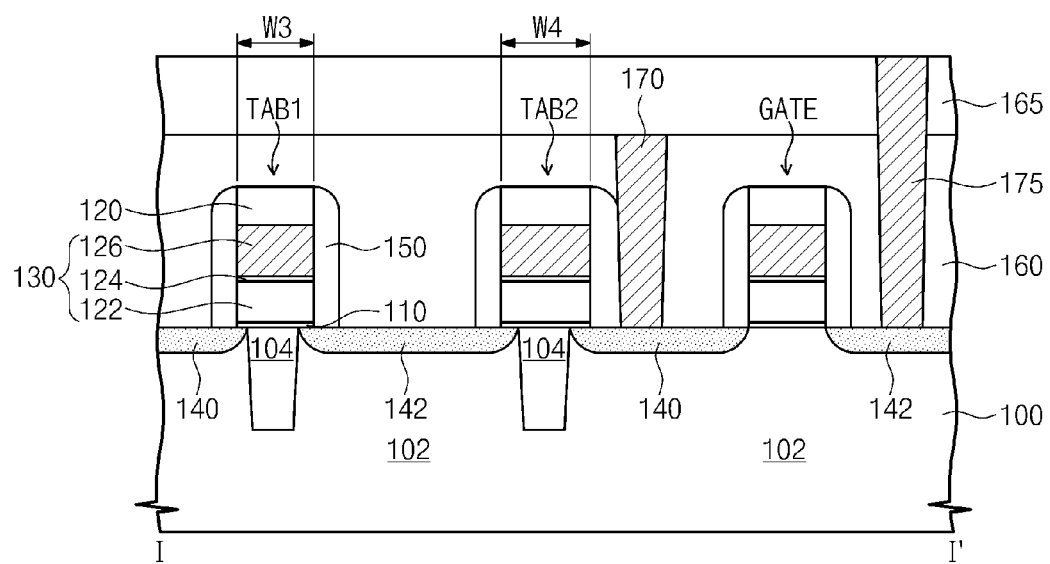
FIG. 5 is a cross-sectional view illustrating a semiconductor device according to an embodiment of the inventive concept.

FIG. 4 is a plan view illustrating a semiconductor device according to an embodiment of the inventive concept. FIG. 5 is a cross-sectional view illustrating a semiconductor device according to an embodiment of the inventive concept. FIG. 5 is a cross-sectional view taken along a line I-I' of FIG. 4.

Referring to FIGS. 4 and 5, the semiconductor device may include a substrate 100, transistors, gate tabs TAB, and contact plugs 170 and 175. The transistors may include a gate insulating layer 110, gate electrodes GATE, and dopant regions 140 and 142.

The substrate 100 may be a silicon substrate, a germanium substrate, or a silicon-germanium substrate, for example. The substrate 100 may include active regions 102 defined by the device isolation layer 104. The device isolation layer 104 in this example is a shallow trench isolation (STI) formed by etching a trench in the semiconductor substrate 100, filling it with a dielectric (e.g., silicon dioxide) and removing excess dielectric from the surface of the substrate 100 (e.g., with a chemical-mechanical planarization).

The gate insulating layer 110 may be disposed on the substrate 100. The gate insulating layer 110 may include silicon oxide, silicon nitride, silicon oxynitride, and/or metal oxide, for example.

The gate electrodes GATE may cross over the active region 102 in a first direction D1. The gate electrodes GATE may be spaced apart from each other and be substantially in parallel with each other. Each of the gate electrodes GATE may include a conductive material. The gate electrodes GATE may include poly-silicon doped with dopants and/or metal. For example, each of the gate electrodes GATE may include a doped poly-silicon layer 122 and a tungsten layer 126 sequentially stacked. In this case, a barrier layer 124 may be disposed between the poly-silicon layer 122 and the tungsten layer 126.

Each of the gate tabs TAB may connect adjacent gate electrodes GATE adjacent to each other and extend in a second direction D2 different from the first direction D1. For example, the second direction D2 may be perpendicular to the first direction D1. Additionally, the gate tabs TAB may be spaced apart from each other and be disposed to be substantially in parallel with each other.

According to some embodiments of the inventive concept, each of the gate tabs TAB may be disposed on a place where each of the gate electrodes GATE is in contact with the device isolation layer 104. Each of the gate tabs TAB may be overlapped with a portion of the device isolation layer 104 and be overlapped with a portion of the active region 102 adjacent to the device isolation layer 104. Thus, it is possible to compensate an effective channel length of the transistor. This will be described in more detail later.

Two gate electrodes GATE adjacent to each other may be electrically connected to each other by the gate tabs TAB. The adjacent two gate electrodes GATE and the gate tabs TAB connecting the adjacent two gate electrodes GATE may constitute one body, which may include one or more homogenous layers. A stacked structure and/or a material of the gate tabs TAB may be the same as the stacked structure and the material of the gate electrode GATE. For example, each of the gate tabs TAB may include a poly-silicon layer 122, a barrier layer 124, and a tungsten layer 126 sequentially stacked. For example, sequential blanket deposition of poly-silicon (which may later be doped or be doped in-situ), barrier material and tungsten may form a composite conductive layer, and the composite conductive layer may be patterned via an etch process to simultaneously form the gate tabs TAB and gate electrodes GATE. This composite conductive layer may be formed over the gate insulation layer. The gate insulation layer may be patterned at the same time, which may use the gate tabs TAB and gate electrodes GATE as an etching mask.

In some embodiments, a space SP (e.g., SP1 or SP2) may be defined by the adjacent two gate electrodes GATE and two gate tabs TAB connecting the adjacent two gate electrodes GATE to each other. That is, the space SP may be surrounded by the adjacent two gate electrodes GATE and two gate tabs TAB connecting the adjacent two gate electrodes GATE to each other. The space SP may include a first region RG1 having a first width W1 and a second region RG2 having a second width W2. Each of the first and second widths W1 and W2 may be widths measured in the first direction D1. The first width W1 may be greater than the second width W2.

As described above, each of the gate tabs TAB may have a structure corresponding to the space SP for defining the space SP including the first and second regions RG1 and RG2 having the first and second widths W1 and W2 different from each other.

The dopant regions 140 and 142 may be formed in the active regions 102 of the substrate 100. In some embodiments, the dopant region 140 formed in the active region 102 may include and extend past the space SP defined by the gate electrodes GATE and the gate tabs TAB. The dopant region 142 formed in the active region may be disposed between and extend under adjacent gate electrodes GATE. The dopant region 142 may extend between and under adjacent gate electrodes of different transistors. The dopant region 142 may not be surrounded the gate tabs TAB. In other words, the second dopant region 142 may be formed in the active region outside the space SP in a plan view. The gate electrode GATE may be disposed on the active region 102 between the first and second dopant regions 140 and 142.

In some embodiments, the first dopant region 140 may be formed in the active region 102 exposed by the space SP. The first dopant region 140 may include a first portion substantially having the first width W1 and a second portion substantially having the second width W2 due to the structure of the space SP.

The contact plugs 170 and 175 may include a first contact plug 170 electrically connected to the first dopant region 140 and a second contact plug 175 electrically connected to the second dopant region 142.

The first contact plug 170 may connect the first dopant region 140 to the word line, such as a word line WL described with respect to FIG. 1, 2 or 3 to provide the word line driving signal WLI to the word line. The first contact plug 170 may be disposed at a side of a center portion of the first dopant region 140. In some embodiments, the first contact plug 170 may be formed on the second portion of the first dopant region 140 that corresponds to the second region RG2 of the space SP.

The second contact plug 175 may electrically connect the second dopant region 142 to a conductive structure. For example, second contact plug 175 may connect to a signal line providing first sub word line control signal PXID, such as that shown in FIGS. 2 and 3.

Hereinafter, the structure of the gate tabs TAB and the space SP confined by the gate tabs TAB and the gate electrodes GATE will be described in more detail.

Figure 6:
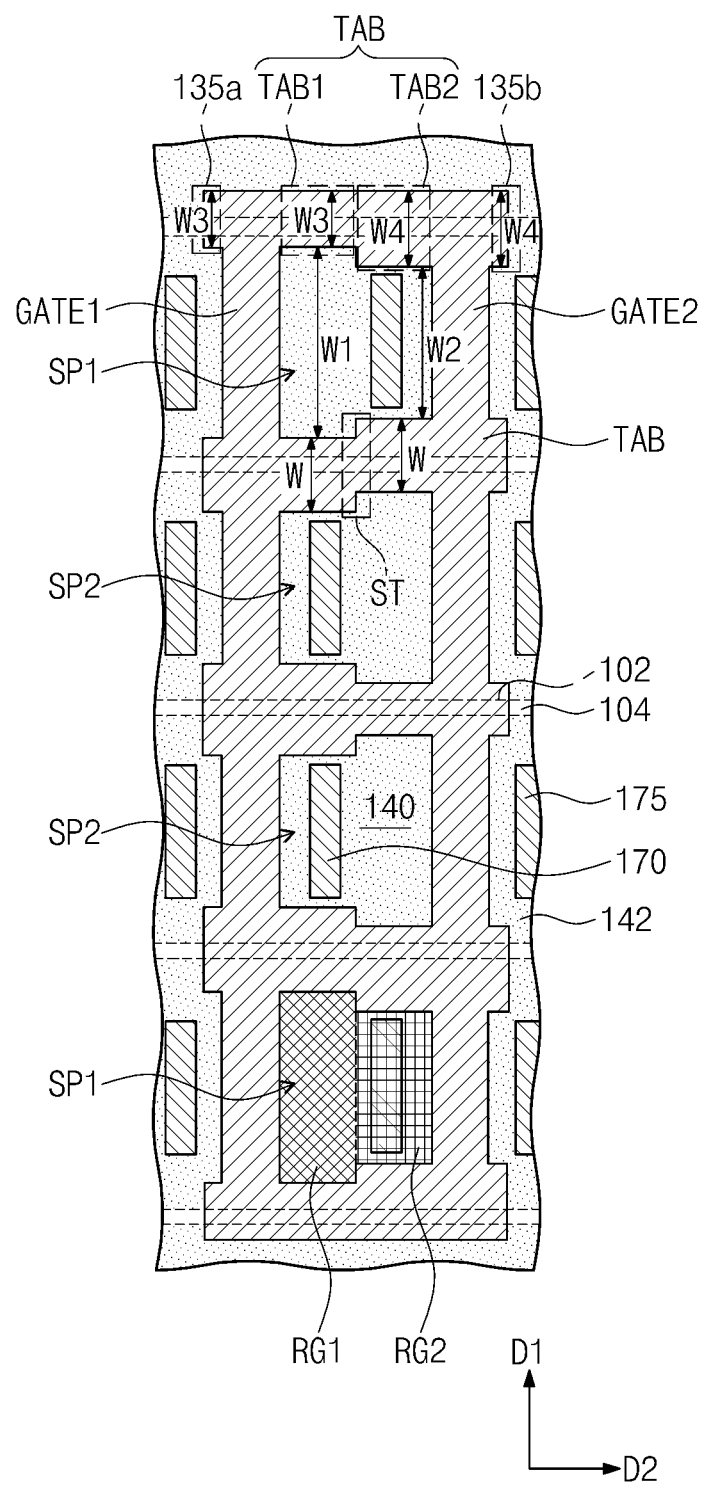
FIG. 6 is an enlarged view of a portion of a semiconductor device in FIG. 4.
Figure 7:
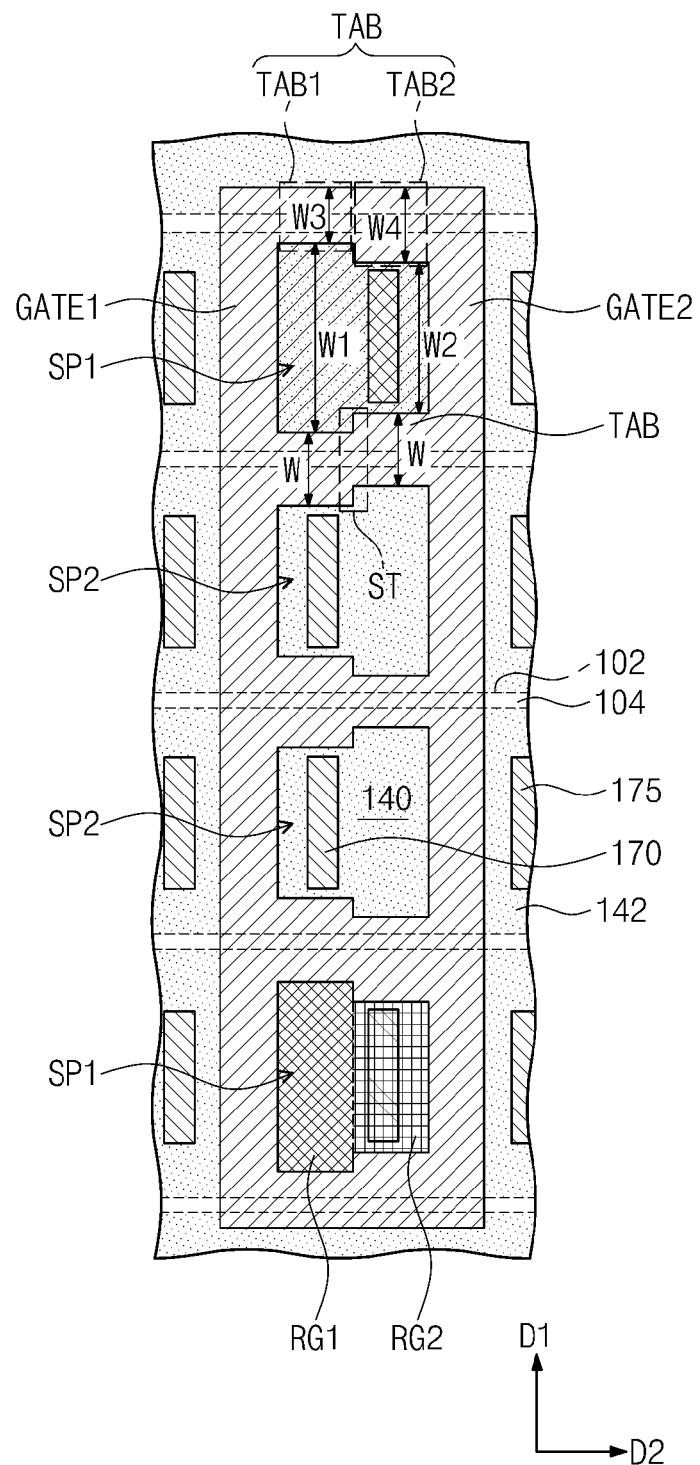
FIGS. 7 and 8 are plan views illustrating semiconductor devices according to other embodiments of the inventive concept.
Figure 8:
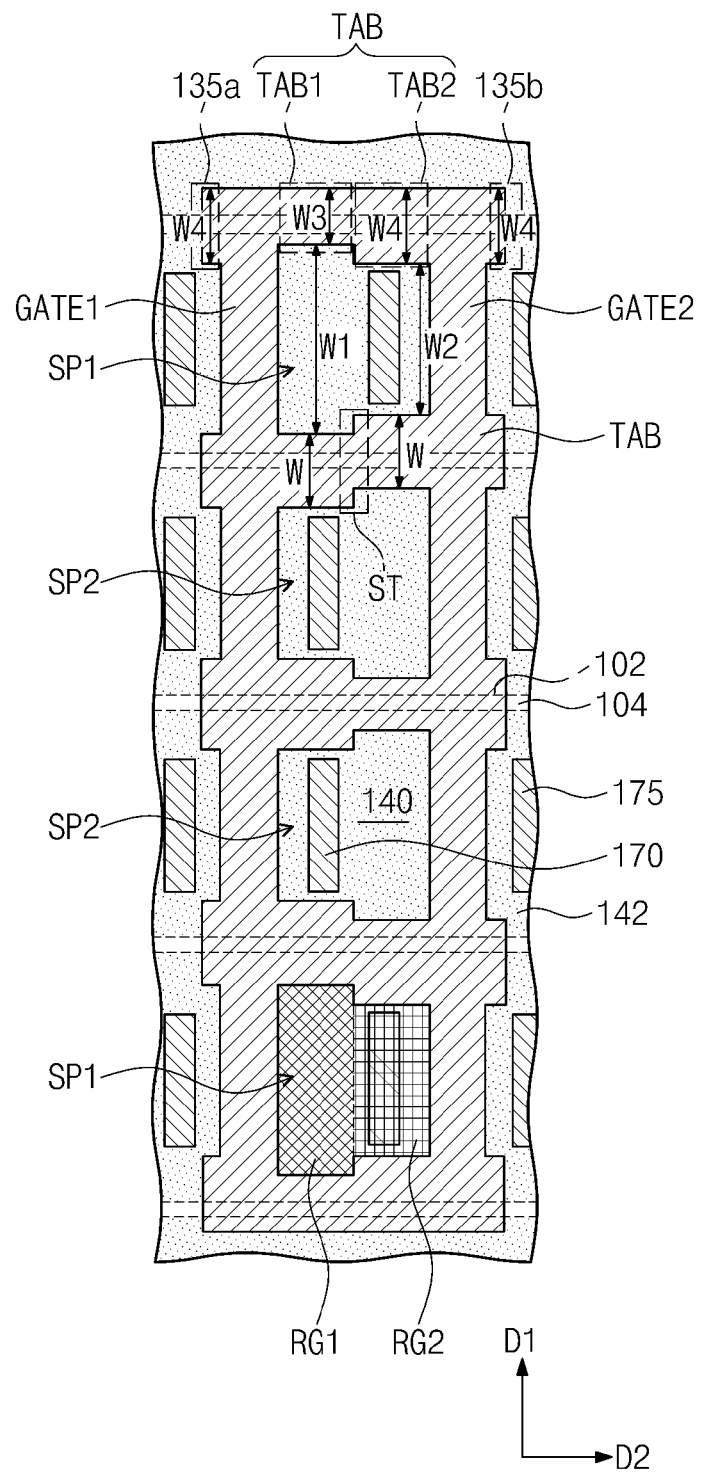

FIG. 6 is an enlarged view of a portion of a semiconductor device in FIG. 4 and FIGS. 7 and 8 are plan views illustrating further exemplary semiconductor devices.

Referring to FIGS. 6 to 8, two adjacent gate electrodes GATE connected by tabs TAB are referenced as a first gate electrode GATE1 and a second gate electrode GATE2. Each of the first and second gate electrodes GATE1 and GATE2 may extend in the first direction D1. The first and second gate electrodes GATE 1 and GATE2 may be spaced apart from each other and be substantially in parallel with each other.

The gate tabs TAB may be disposed between and connect the first and second gate electrodes GATE1 and GATE2. The gate tabs TAB may extend in the second direction in order to electrically connect the first and second gate electrodes GATE1 and GATE2 to each other. The gate tabs TAB may be spaced apart from each other and be substantially in parallel with each other. For example, five gate tabs TAB may be spaced apart from each other in parallel between the first and second gate electrodes GATE1 and GATE2. The present embodiment is described using the five gate tabs TAB as an example. However, the present invention is not limited to the number of the gate tabs TAB.

As described with reference to FIGS. 4 and 5 above, the space SP may be confined by the adjacent two gate electrodes GATE1 and GATE2 and the adjacent two gate tabs TAB. Here, sidewalls of the gate electrodes GATE (GATE1 or GATE2) confining the space SP are referenced as inner sidewalls. And sidewalls of the gate electrodes GATE1 opposite to the inner sidewalls of GATE1, as well as sidewalls of the gate electrodes GATE2 opposite to the inner sidewalls of GATE2, are referenced as outer sidewalls.

The space SP may include the first region RG1 having the first width W1 and the second region RG2 having the second width W2. Each of the first and second widths W1 and W2 is a distance measured in the first direction D1.

As illustrated in FIGS. 4 and 5, when the five gate tabs TAB are disposed between the adjacent two gate electrodes GATE1 and GATE2, fourth spaces SP may be confined by the gate electrodes GATE and the gate tabs TAB. Each of the fourth spaces SP includes the first region RG1 and the second region RG2. The spaces SP may include a first space SP1 of which the first region RG1 is adjacent to the first gate electrode GATE1, and a second space SP2 of which the first region RG1 is adjacent to the second gate electrode GATE2.

When the first space SP1 is adjacent to the second space SP2, the gate tab TAB between the first and second spaces SP1 and SP2 may have a uniform width but a bending portion ST. The bending portion ST of the gate tab TAB may be disposed at a place where a width of the space SP is changed.

When the first spaces SP1 are adjacent to each other or the second spaces SP2 are adjacent to each other, the gate tab TAB between the first spaces SP1 adjacent to each other or between the second spaces SP2 adjacent to each other may include portions having widths different from each other. In more detail, the gate tab TAB therebetween may include a first portion TAB1 having a third width W3 and a second portion TAB2 having a fourth width W4 greater than the third width W3. The first region RG1 of the first space SP1 (or the second space SP2) may be confined by the first portion TAB1 having the third width W3 of the gate tab TAB, and the second region RG2 of the first space SP1 (or the second space SP2) may be confined by the second portion TAB having the fourth width W4 of the gate tab TAB.

Referring to FIG. 6, each of the gate tabs TAB may include protrusions 135a and 135b respectively protruding with respect to the outer sidewalls of the gate electrodes GATE1 and GATE2 in parallel with the second direction D2. The protrusions 135a and 135b of the gate tab TAB may have the same widths of portions of the gate tab TAB adjacent to the protrusions 135a and 135b, respectively. For example, the protrusion 135a protruding from the first portion TAB1 of the gate tab TAB may have the third width W3 and the protrusion 135b protruding from the second portion TAB2 of the gate tab TAB may have the fourth width W4.

Referring to FIG. 7, sidewalls of the gate tab TAB parallel to the outer sidewall of the gate electrode GATE may be substantially coplanar with the outer sidewalls of the gate electrodes GATE1 and GATE2, respectively.

Referring to FIG. 8, each of the gate tabs TAB may include protrusions 135a and 135b respectively protruding with respect to the outer sidewalls of the gate electrodes GATE1 and GATE2 in parallel with the second direction D2. The protrusions 135a and 135b of the gate tab TAB may be substantially the same as the maximum width of the gate tab TAB. When the gate tab TAB includes the third width W3 and the fourth width W4 greater than the third width W3, all of the protrusion 135a protruding from the first portion TAB1 and the protrusion 135b protruding from the second portion TAB2 of the gate tab TAB may have the fourth width W4.

The structures of the gate tabs TAB described above are explained as examples. However, the inventive concept is not limited thereto. In other embodiments, when the structures of the gate tabs may be variously modified and may confine the first and second regions RG1 and RG2 of the space SP.

Figure 9A:
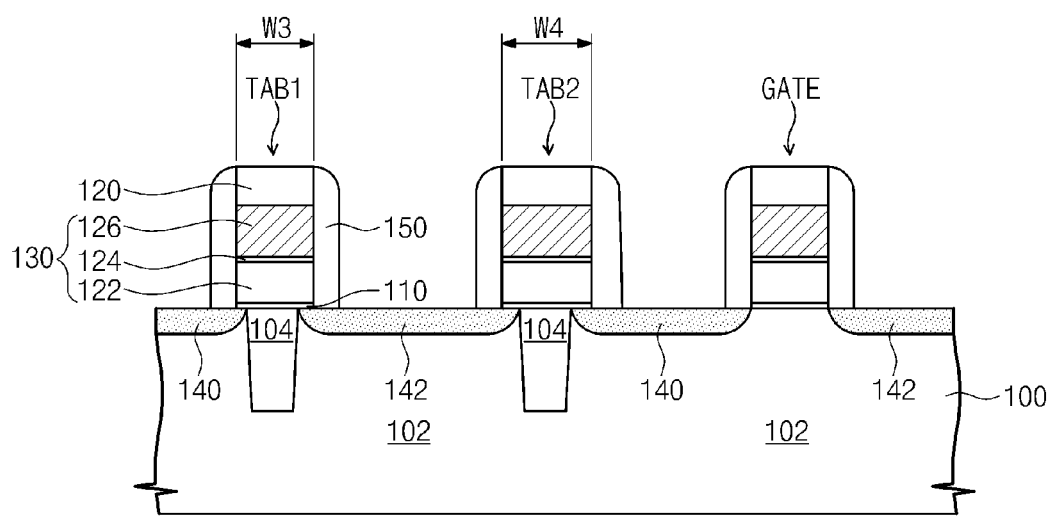
FIGS. 9A and 9B are cross-sectional views illustrating a method of manufacturing a semiconductor device according to an embodiment of the inventive concept.
Figure 9B:
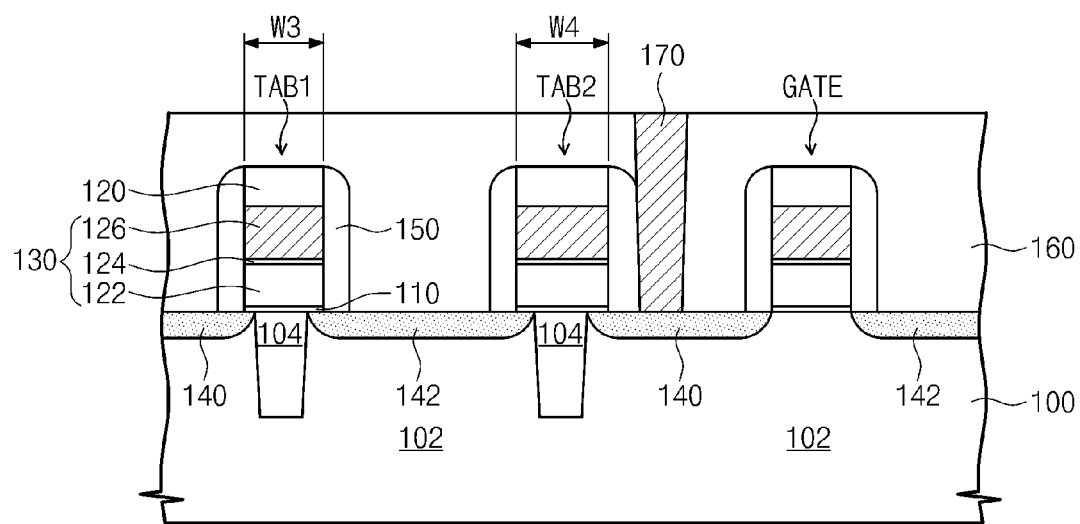

FIGS. 9A and 9B are cross-sectional views illustrating a method of manufacturing a semiconductor device according to an embodiment of the inventive concept.

Referring to FIG. 9A, a transistor and gate tabs TAB may be formed on a substrate 100.

In more detail, a device isolation layer 104 may be formed on the substrate 100 by a shallow trench isolation (STI) process. The device isolation layer 104 may define active regions 102. A gate insulating layer 110, a conductive layer (not shown), and a mask 120 may be sequentially formed on the substrate 100. The conductive layer may have a multi-layered structure. For example, the conductive layer may include a poly-silicon layer 122, a barrier layer 124, and a metal layer 126 sequentially stacked. The conductive layer 122, 124, and 126 and the gate insulating layer 110 may be etched by an etching process using the mask 120. The gate insulating layer 110, gate electrodes GATE and the gate tabs TAB may be formed simultaneously by the etching process.

Additionally, a space SP may be confined by the gate electrodes GATE and the gate tabs TAB. In some embodiments, the space SP may include a first region RG1 having a first width W1 and a second region RG2 having a second width W2 smaller than the first width W1.

Referring to FIGS. 4, 6, 7, and 8, the gate electrodes GATE and the gate tabs TAB may be connected to each other to constitute one body. Additionally, structures of the gate tabs TAB may have various structures as illustrated in FIGS. 4, 6, 7, and 8. The various structures of the gate tabs TAB may depend on a structure of the mask 120.

Dopants may be injected into the active region 102 using the gate electrode GATE and tabs TAB as a mask. Dopants may be injected at both sides of the gate electrode GATE and tabs TAB. After injection into the substrate, dopants may diffuse laterally under the gate electrode GATE and tabs TAB to form dopant regions 140 and 142. Device isolation layer 104 may block further diffusion of dopants, and thus lateral diffusion under tabs TAB may end at the device isolation layer 104. The dopant regions 140 and 142 may include a first dopant region 140 formed in the active region 102 under the space SP and a second dopant region 142 formed in the active region 102 at a side of an outer sidewall of the gate electrode GATE. The second dopant region 142 may be formed in the active region 102 outside of the space SP when viewed from a plan view.

Thus, a transistor and the gate tabs TAB may be formed. In FIG. 9A, the transistor includes the gate insulating layer 110, the gate electrode GATE and the dopant regions 140 and 142. Note that in manufacturing the devices of the embodiments described herein, multiple transistors may be formed, although only one is shown in FIG. 9A.

Referring to FIG. 9B, a first interlayer insulating layer 160 and a first contact plug 170 may be formed.

In more detail, the first interlayer insulating layer 160 may be formed to cover the transistor and the gate tabs TAB. The first interlayer insulating layer 160 may be patterned to form a contact hole exposing the first dopant region 140. The contact hole may expose the first dopant region 140 corresponding to the second region RG2 of the space SP.

After a conductive layer (not shown) filling the contact hole may be formed on the first interlayer insulating layer 160, the conductive layer may be planarized until the first interlayer insulating layer 160 is exposed, thereby forming the first contact plug 170.

Even though not shown in more detail in the drawings, the first contact plug 170 may be electrically connected to a bit line.

Referring to FIG. 5 again, a second interlayer insulating layer 165 may be formed on the first interlayer insulating layer 160 and a second contact plug 142 may be formed to be electrically connected to the second dopant region 142.

Even though not shown in more detail in the drawings, the second contact plug 175 may be electrically connected to a conductive structure, such as a conductive wiring providing the first sub word line control signal of FIGS. 2 and 3.

Figure 10A:
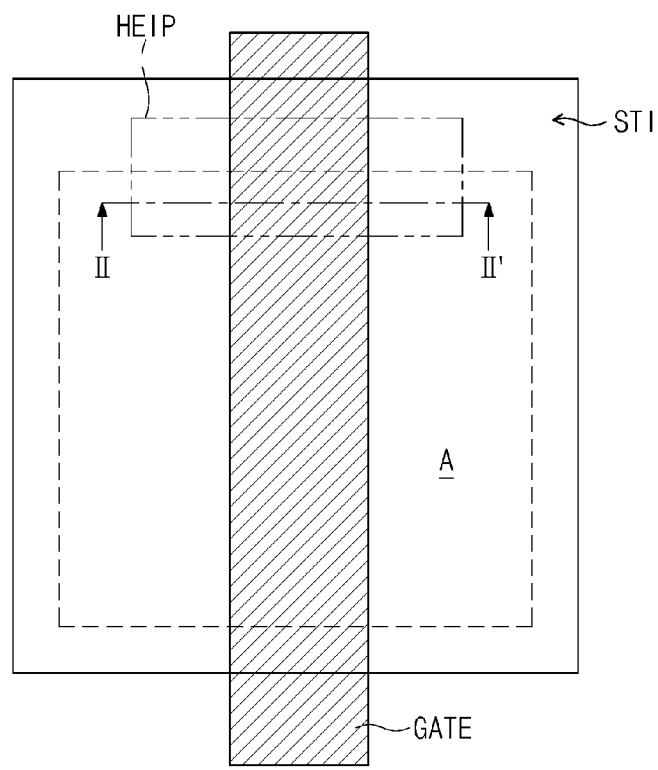
FIG. 10A is a plan view in order to explain a HEIP phenomenon of a general PMOS transistor.
Figure 10B:
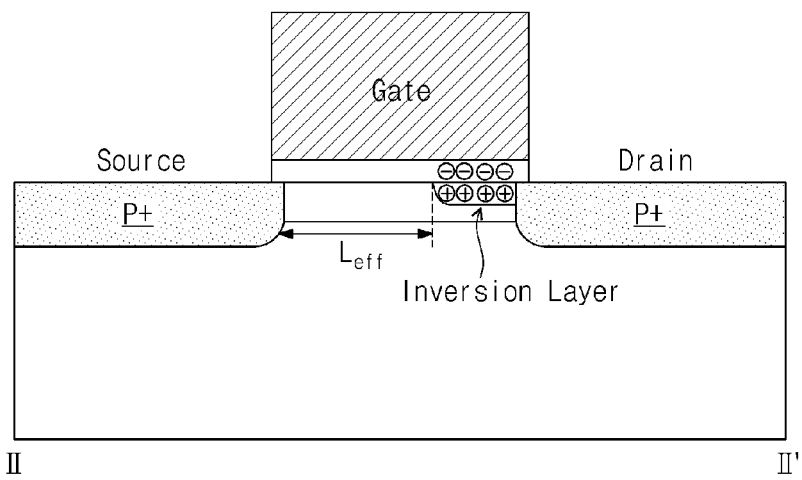
FIG. 10B is a cross-sectional view in order to explain a HEIP phenomenon o a general PMOS transistor.

FIG. 10A is a plan view in order to explain a HEIP phenomenon o a general PMOS transistor and FIG. 10B is a cross-sectional view in order to explain a HEIP phenomenon o a general PMOS transistor. FIG. 10B is a cross-sectional view taken along a line II-II' of FIG. 10A.

Referring to FIGS. 10A and 10B, a PMOS transistor may include a substrate having active regions A defined by a device isolation layer STI, an gate insulating layer disposed on the substrate, a gate electrode disposed on the gate insulating layer, and source/drain regions formed in an exposed substrate at both sides of the gate electrode.

The PMOS transistor uses holes as carriers. Hot electrons may be incidentally generated by the holes. The hot electrons may be injected into the gate insulating layer adjacent to a channel, so that a portion of the channel of the PMOS transistor may be inversed. Thus, a channel length of the PMOS transistor may be reduced, so that an effective channel length of the PMOS transistor may be reduced. The undesired inversion phenomenon may cause a hot electron induced punch-through (HEIP) phenomenon. Thus, a leakage current may increase when the PMOS transistor is turned-off, a power consumption of the PMOS transistor may increase, an operation speed of the PMOS transistor may be reduced, and a punchthrough voltage may be reduced.

The HEIP phenomenon may be mainly generated in the active region (HEIP region) adjacent to the device isolation layer STI as illustrated in FIG. 10A.

According to some embodiments, since the gate tab is formed on the place where the device isolation layer STI is in contact with the active region, it is possible to compensate the reduction of the channel length caused by the HEIP phenomenon. As an overlapping area of the gate tab and the active region becomes larger, it is possible to decrease deterioration caused by the HEIP phenomenon.

Figure 11:
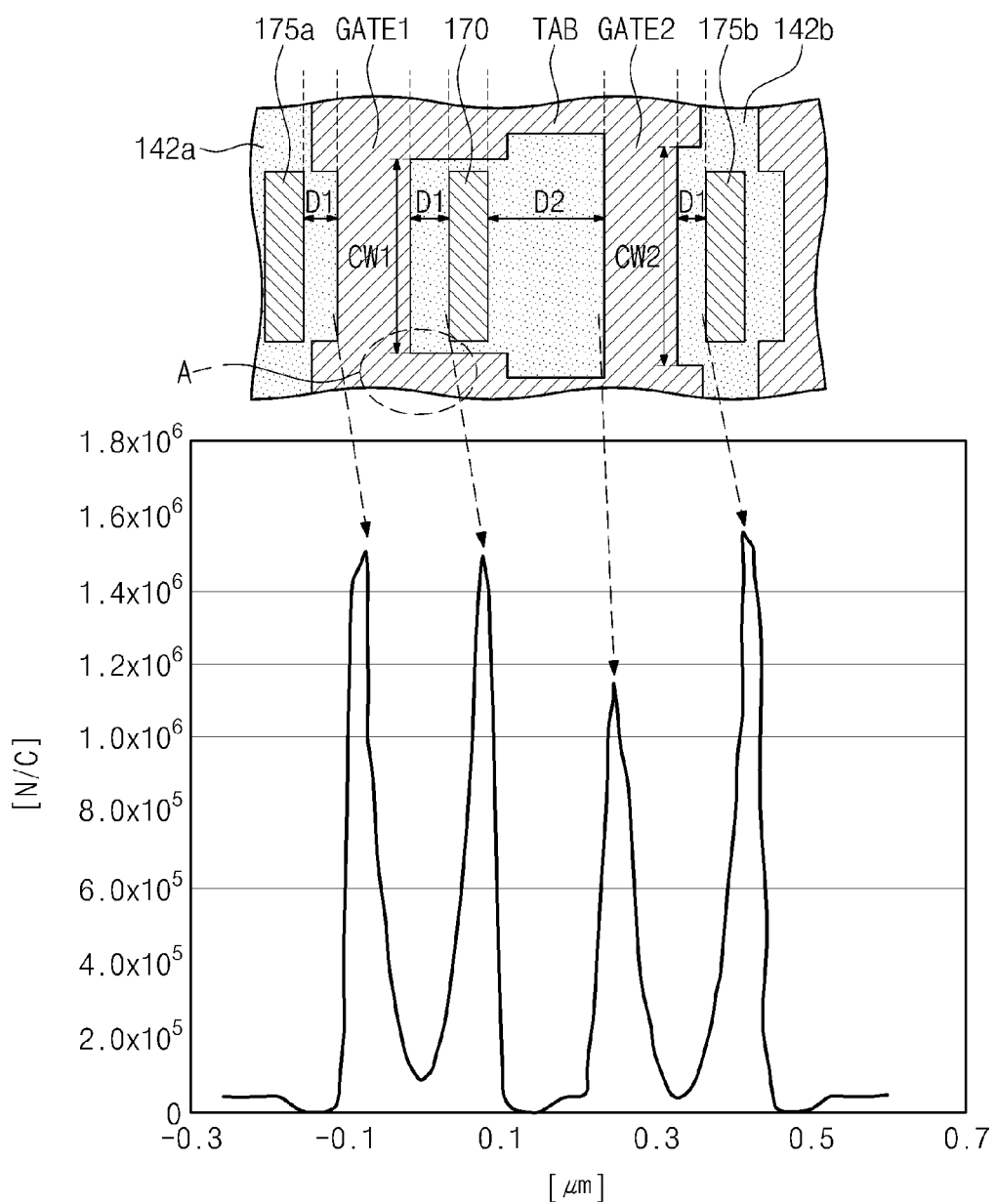
FIG. 11 is a graph illustrating an electric field of a semiconductor device according to an embodiment of the inventive concept.

FIG. 11 is a graph illustrating an electric field of a semiconductor device according to an embodiment. The semiconductor device illustrated in FIG. 11 is an enlarged view of a portion of the semiconductor device illustrated in FIG. 4.

Referring to FIG. 11, the semiconductor device may include the transistors, the gate tabs TAB, and contact plugs 170, 175a, and 175b that are described with reference to FIGS. 4 and 5. The transistor may be a PMOS transistor.

For the purpose of ease and convenience in explanation, the adjacent gate electrodes connected to each other by the gate tabs TAB are defined as the first gate electrode GATE1 and the second gate electrode GATE2, respectively. The contact plugs 170, 175a, and 175b include a first contact plug 170 and second contact plugs 175a and 175b. The first contact plug 170 is disposed on the first dopant region 140 (reference to FIG. 4) between the first and second gate electrodes GATE1 and GATE2 and between the gate tabs TAB (i.e. under the space SP of FIG. 4). The second contact plugs 175a and 175b are disposed on the second dopant regions 142 (reference to FIG. 4) adjacent to the outer sidewalls of the first and second electrodes GATE1 and GATE2, respectively. The first electrode GATE1, the first contact plug 170, and the second electrode GATE2 are disposed between the second contact plugs 175a and 175b. That is, the second contact plugs 175a and 175b may be respectively disposed on the second dopant regions 142 outside the space SP in a plan view.

A transistor may be formed from the structure of FIG. 11. For example, contact plugs 175a and 175b may both connect to the same conductive wire (e.g., a signal wire providing signal PXID of FIGS. 2 and 3). A first source/drain S/D may be formed by dopant region 140 and a second source/drain S/D may be formed by dopant regions 142a and 142b. Dopant regions 142a and 142b may be bounded by device isolation layers 104 and adjacent gate electrodes GATE of different electrical nodes (see FIG. 4, e.g.). The gate of the transistor may be formed of GATE1 and GATE2. The channel of the transistor may be formed as two discrete channel portions under GATE1 and GATE2, respectively. Thus a channel width of the transistor in the example of FIG. 11 may substantially equal CW1+CW2 (a first portion of the channel width corresponding to width CW1 under GATE 1 and a second portion of the channel width corresponding to width CW2 under GATE2). The transistor may include gate tabs TAB connecting GATE1 and GATE2. Thus, the gate electrodes GATE1 and GATE2 and the gate tabs TAB may form conductive ring structure confining dopant region 140. Note that use of the word "ring" in this application should not be limited to circular rings or connote non-angular edges, although it may encompass the same. In addition, the rings joined together, such as those conductive rings of FIG. 4 (formed of gate electrodes GATE and tabs TAB) are each considered individually to be a ring structure. The transistor may be a PMOS transistor.

When the transistor is a PMOS transistor providing a word line driving signal WLI to a word line WL (not shown in FIG. 11) of a sub-word line driving circuit (such as PMOS transistor MP of FIG. 3), dopant regions 142a and 142b may be the source of the PMOS transistor and dopant region 140 may be the drain of the PMOS transistor. Contact plugs 175a and 175b may both connect the source of the PMOS transistor (connect to dopant regions 142a and 142b, respectively) to the same conductive wire that provides signal PXID of FIGS. 2 and 3. The word line driving signal WLI may be provided to a word line (not shown) via drain (dopant region 140) and contact plug 170. Gate electrodes GATE1 and GATE2 may be connected to main word line driving signal NWEI, such as that provided by main word line decoder 50 via main word lines WLE.

It should be emphasized that the invention is not limited to a transistor of a sub-word line driving circuit, nor to a PMOS transistor. The transistor may be an NMOS transistor. In addition, when the transistor is used with a sub word line driving circuit, different circuitry activating the sub word line driving circuit and different layouts may be used. See, e.g., U.S. Pat. Nos. 7,729,195 and 8,228,755 regarding the same, the contents of each of which are hereby incorporated by reference. For example, FIG. 1 of U.S. Pat. No. 8,228,755 shows exemplary circuitry for generating PXID from PXI, and as well, a different sub word line driving circuit, both of which may be used (together or separately) with this invention.

The second contact plug 175a is spaced apart from the first gate electrode GATE1 by a first distance D1. Likewise, the first contact plug 170 is spaced apart from the first gate electrode GATE1 by the first distance D1 and the second contact plug 175b is spaced apart from the second gate electrode GATE2 by the first distance D1. That is, the distance between the second contact plug 175a and the first gate electrode GATE1 may be substantially the same as each of the distance between the first contact plug 170 and the first gate electrode GATE1 and the distance between the second contact plug 175b and the second gate electrode GATE2. On the contrary, the first contact plug 170 is spaced apart from the second gate electrode GATE2 by a second distance D2 greater than the first distance D1.

Figure 13:
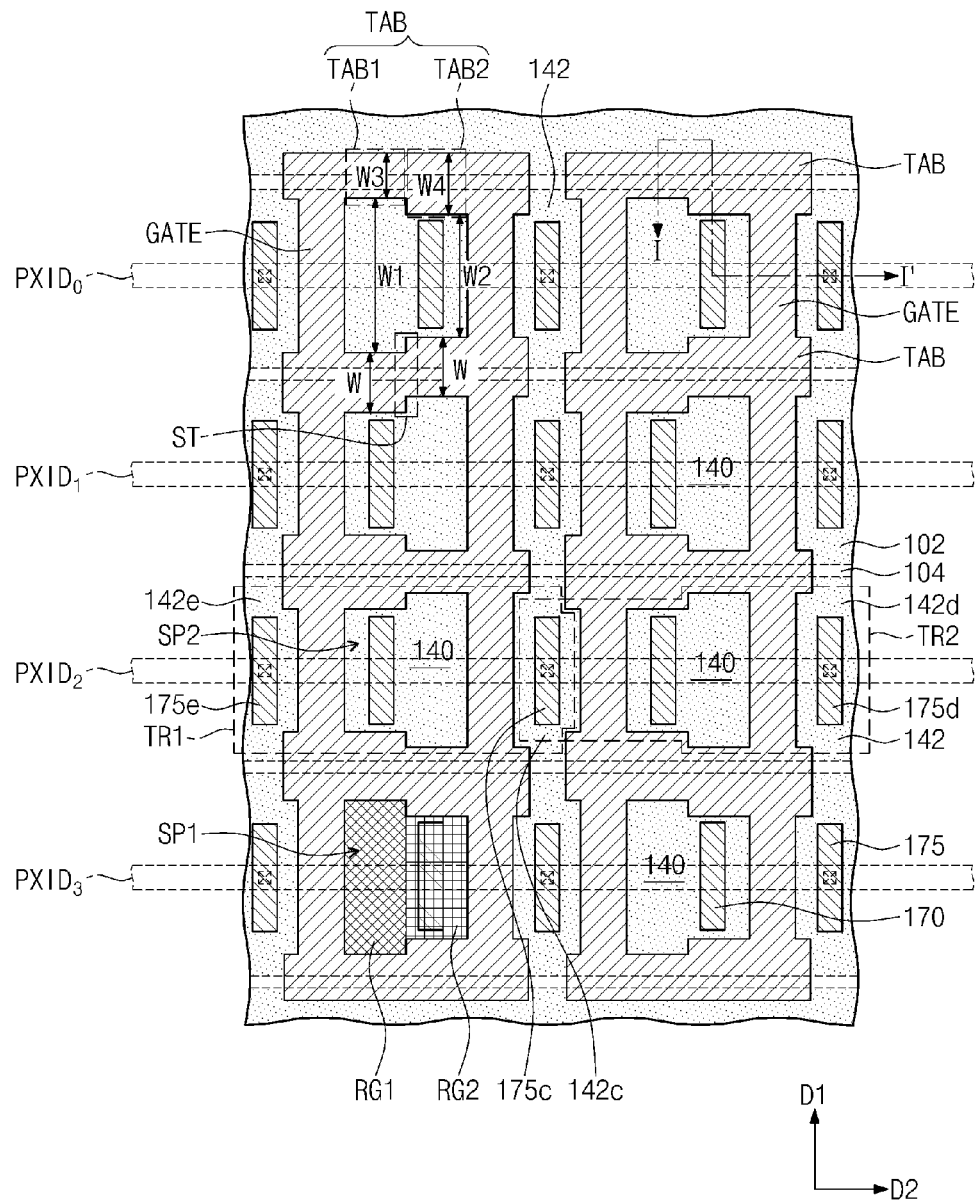
FIG. 13 is a plan view illustrating a semiconductor device according to embodiments of the inventive concept.

FIG. 13 illustrates multiple ones of the transistor described with respect to FIG. 11 formed with the structure of FIG. 4. While only two transistors TR1 and TR2 are identified, the exemplary structure of FIG. 13 forms four transistors for every separate electrical node forming the gate electrodes GATE (e.g., eight transistors are shown in FIG. 13, four transistors for each of the two separate electrical nodes forming the gate electrodes GATE). It will be noted that transistors TR1 and TR2 share a source/drain S/D 142c connected to a shared contact plug 175c. Some or all of source/drain regions S/D 142d and 142e and contact plugs 175d and 175e may also be shared with other transistors (not shown in FIG. 13) having gate electrodes GATE separate from those shown in FIG. 13 (e.g., to the left and right of the structure shown in FIG. 13). Each of the gate electrodes GATE formed of a separate electrical node may be connected to a respective separate selection signal, such as a separate main word line driving signal NWEI (e.g., provided by main word line decoder 50 via main word line WLE—main word line WLE and connections thereto are not shown in FIG. 13). Dopant regions 142 aligned in a row (left and right in FIG. 13) may be commonly connected to a respective conductive wire PXID[0-3] via contact plugs 175.

Referring back to FIG. 11, simulation was performed for electric fields between the second contact plug 175a and the first gate electrode GATE1, between the first gate electrode GATE1 and the first contact plug 170, between the second gate electrode GATE2 and the second contact plug 175b, and between the first contact plug 170 and the second gate electrode GATE2.

As a result, the electric fields between the second contact plug 175a and the first gate electrode GATE1, between the first gate electrode GATE1 and the first contact plug 170 and between the second gate electrode GATE2 and the second contact plug 175b show the maximum electric field of about $1.5 \times 10^6$ N/C. Meanwhile, the electric field between the first contact plug 170 and the second gate electrode GATE2 shows the maximum electric field of about $1.18 \times 10^6$ N/C.

Generally, the HEIP phenomenon may be more dominant in a portion of which the maximum electric field is higher. Thus, the HEIP phenomenon may be more dominant in portion A of FIG. 11.

Meanwhile, the effect of the HEIP phenomenon may lessened as the overlapping area of the gate tab TAB and the active region 102 increases. However, if the overlapping area of the gate tab TAB and the active region 102 increases, a width of the transistor may be reduced (e.g., the width CW1 of the channel portion of the transistor is made smaller in increasing the size of the TAB portion), so that a current amount of the transistor may be reduced.

Thus, since the width of the gate tab TAB, which is disposed in the portion A dominantly influenced by the HEIP phenomenon, is greater than a width of other portions of the gate tab TAB, it is possible to reduce the HEIP phenomenon. In addition, undesired decreasing of the transistor's channel width is avoided as the width of the portion of the channel under GATE2 (CW2) is maintained, mitigating any undesired reduction of the current amount of the transistor by reducing the width of other portions of the gate tab TAB.

Figure 12A:
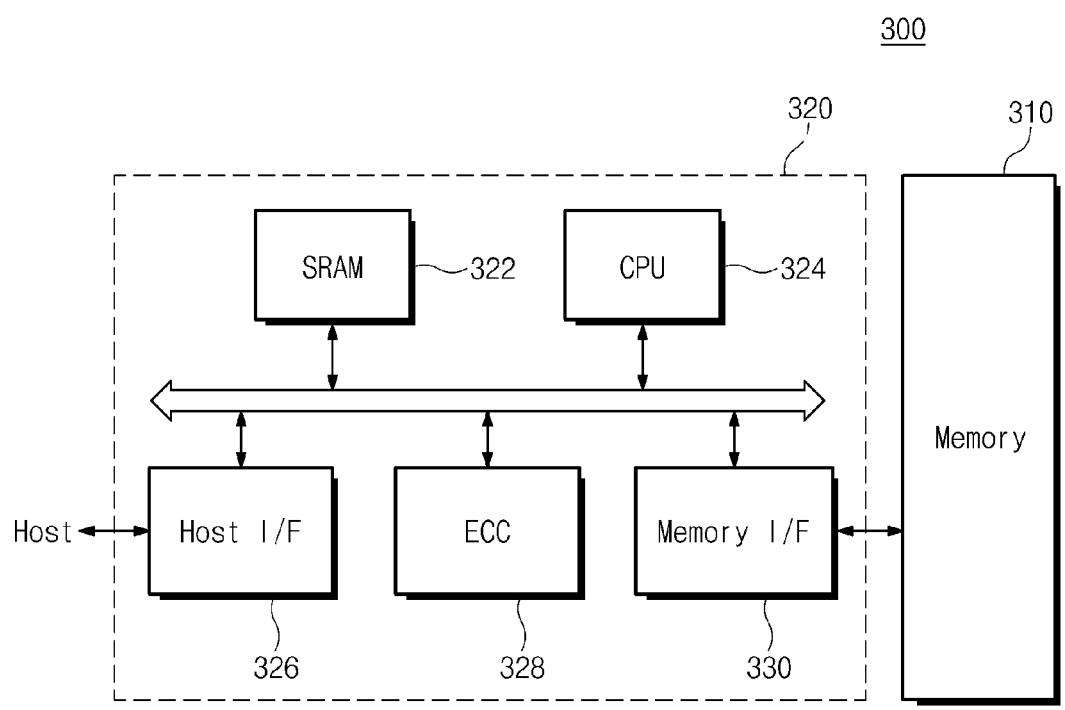
FIG. 12A is a schematic block diagram illustrating an example of memory cards including semiconductor according to embodiments of the inventive concept.

FIG. 12A is a schematic block diagram illustrating an example of memory cards including semiconductor according to embodiments of the inventive concept.

Referring to FIG. 12A, the semiconductor device according to embodiments of the inventive concept may be applied to a memory card 300. For example, the memory card 300 may include a memory controller 320 that controls data communication between a host and a memory device 310. An SRAM device 322 may be used as an operation memory of a central processing unit (CPU) 324. A host interface unit 326 may be configured to include a data communication protocol between the memory card 300 and the host. An error check and correction (ECC) block 328 may detect and correct errors of data that are read out from the memory device 310. A memory interface unit 330 may interface the memory device 310. The CPU 324 controls overall operations of the memory controller 324.

If the memory device 310 applied to the memory card 300 includes the semiconductor device according to embodiments of the inventive concept, the HEIP phenomenon may be minimized or prevented and the current amount may not be reduced. Thus, it is possible to improve an electrical reliability of the semiconductor device.

Figure 12B:
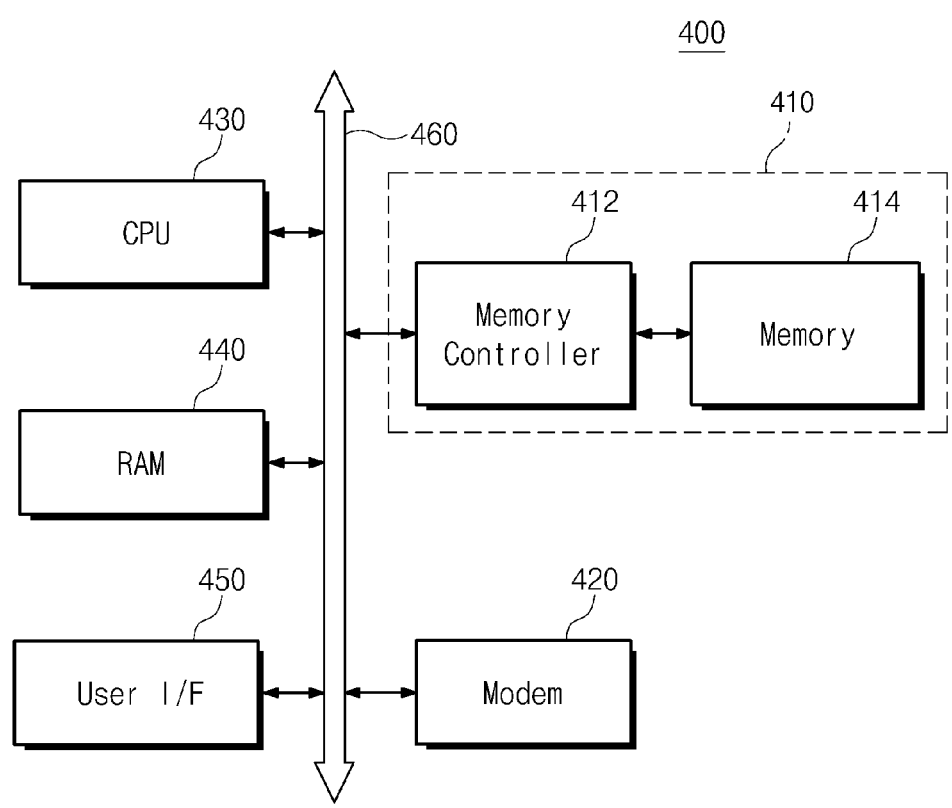
FIG. 12B is a schematic block diagram illustrating an example of information processing systems including semiconductor according to embodiments of the inventive concept.

FIG. 12B is a schematic block diagram illustrating an example of information processing systems including semiconductor according to embodiments of the inventive concept.

Referring to FIG. 12B, an information processing system 400 may include the semiconductor device according to embodiments of the inventive concept. The information processing system 400 may include a mobile device or a computer. For example, the information processing system 400 may include a modem 420, a central processing unit (CPU) 430, a RAM 440, and a user interface unit 450 that are electrically connected to a memory system 410 through a system bus 460. The memory system 410 may store data processed by the central processing unit 1330 or data inputted from an external device. The memory system 410 may include a memory device 412 and a memory controller 414. The memory system 410 may be substantially the same as the memory card 300 described with reference to FIG. 12A. The information processing system 400 may be realized as a memory card, a solid state disk (SSD) device, a camera image sensor and another type of application chipset. For example, the memory system 410 may consist of the SSD device. In this case, the information processing system 400 may stably and reliably store massive data.

According to embodiments of the inventive concept, it is possible to suppress the HEIP phenomenon due to the gate tabs. Additionally, it is possible to suppress the reduction of the current amount of the transistor due to the structure of the gate tabs. Thus, an electrical reliability of the semiconductor device may be improved.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   a substrate including an active region defined by a device isolation layer;
   gate electrodes of a first transistor extending in a first direction on the substrate and spaced apart from each other;
   gate tabs extending in a second direction different from the first direction and connecting adjacent gate electrodes to each other, the gate tabs spaced apart from each other; and
   a first contact plug contacting the active region at a first region encompassed by the adjacent gate electrodes and adjacent gate tabs, the first region being a first source/drain of the first transistor,
   wherein the first region includes a first sub-region having a first distance between adjacent gate tabs and a second sub-region having a second distance between the adjacent gate tabs, the second distance being smaller than the first distance; and
   wherein the first contact plug is disposed on the active region in the second sub-region.

2. The semiconductor device of claim 1, wherein each of the gate tabs extends over a portion of the active region adjacent to the device isolation layer.

3. The semiconductor device of claim 1, further comprising:
   a second region formed in the active region outside the first region encompassed by the adjacent gate electrodes and adjacent gate tabs, the second region being a second source/drain of the first transistor.

4. The semiconductor device of claim 1, wherein one of the gate tabs includes a first portion having a third width and a second portion having a fourth width greater than the third width.

5. The semiconductor device of claim 1, wherein one of the gate tabs has a uniform width and includes a bent portion.

6. The semiconductor device of claim 1, wherein each of the gate tabs has a protrusion protruding with respect to an outer sidewall of the gate electrode in the second direction.

7. The semiconductor device of claim 6, wherein the protrusion of each of the gate tabs has the same width as a width of a portion of the gate tab adjacent to the protrusion.

8. The semiconductor device of claim 6, wherein the protrusion of the each of the gate tabs has the same width as the maximum width of each of the gate tabs.

9. The semiconductor device of claim 1, wherein each of the gate tabs has a sidewall substantially flush with an outer sidewall of the gate electrode.

10. The semiconductor device of claim 1, wherein the gate electrodes include a first gate electrode and a second gate electrode adjacent to the first electrode;
wherein the first gate electrode is connected to the second electrode by the gate tabs.

11. The semiconductor device of claim 1, wherein each of the gate tabs and each of the gate electrodes are formed of the same one or more conductive layers.

12. The semiconductor device of claim 1, wherein the adjacent gate electrodes and the gate tabs connecting the adjacent gate electrode are portions of the same electrical node.

13. A semiconductor device comprising:
a semiconductor substrate, the semiconductor substrate including an active region defined by one or more device isolation insulators;
a first transistor formed at the active region, the first transistor comprising:
a conductive ring formed on the active region, the conductive ring comprising a first gate, a second gate, a first tab portion connecting the first gate to the second gate, and a second tab portion spaced apart from the first tab portion connecting the first gate to the second gate, the second tab portion being spaced apart from the first tab portion a first distance at the first gate and a second distance at the second gate, the first distance being smaller than the second distance;
a first source/drain formed at the active region within an area confined by the conductive ring;
a second source/drain formed at the active region outside the conductive ring; and
a first conductive via connecting to the first source/drain region at a location closer to the first gate than to the second gate.

14. The semiconductor device of claim 13,
wherein the device isolation insulators comprise first and second shallow trench isolation layers, and
wherein the first tab portion is formed over the first shallow trench isolation layer and the second tab portion is formed over the second shallow trench isolation layer.

15. The semiconductor device of claim 13, further comprising:
wherein the second source/drain comprises a first region of the active region outside the conductive ring and a second region of the active region outside the conductive ring, and wherein the semiconductor device further comprises:
a conductive wire; and
a second conductive via electrically connecting the first region of the second source/drain to the conductive wire, and
a third conductive via electrically connecting the second region of the second source/drain to the conductive wire.

16. The semiconductor device of claim 13,
wherein the first transistor is a first transistor of a word line driver and the semiconductor device further comprises:
a word line connected to the first conductive via.

17. The semiconductor device of claim 13,
wherein the first source/drain is formed of a dopant region within the active region, the dopant region comprised of the active region corresponding to the area confined by the conductive ring and extending to the first and second device isolation insulators.

18. The semiconductor device of claim 13, further comprising:
a plurality of first transistors, each first transistor sharing a tab portion with an adjacent first transistor.

19. The semiconductor device of claim 13, further comprising:
a plurality of first transistors, each first transistor sharing a second source/drain with an adjacent first transistor.

* * * * *